United States Patent [19]

Mirkin et al.

[11] Patent Number: 5,338,571

[45] Date of Patent: Aug. 16, 1994

[54] METHOD OF FORMING SELF-ASSEMBLED, MONO- AND MULTI-LAYER FULLERENE FILM AND COATED SUBSTRATES PRODUCED THEREBY

[75] Inventors: Chad A. Mirkin, Skokie; Kaimin Chen, Chicago; W. Brett Caldwell, Glenview, all of Ill.

[73] Assignee: Northwestern University, Evanston, Ill.

[21] Appl. No.: 16,820

[22] Filed: Feb. 10, 1993

[51] Int. Cl.$^5$ .............................................. B05D 3/00
[52] U.S. Cl. ........................ 427/299; 427/58; 427/162; 427/322; 427/331; 427/402; 427/444
[58] Field of Search ............... 427/299, 402, 322, 162, 427/64, 62, 444, 331, 58

[56] References Cited

U.S. PATENT DOCUMENTS

5,178,980  1/1993  Mort et al. ........................... 430/58

OTHER PUBLICATIONS

Fullerene Self-Assembly onto (MeO)$_3$Si(CH$_2$($_3$N-H$_2$-Modified Oxide Surfaces; J. Am. Chem. Soc. 1993, 115, pp. 1193–1194; Chen, Caldwell and Mirkin (no mo.).

Solid C$_{60}$: A New Form of Carbon; Nature, vol. 347, Sep. 27, 1990, pp. 354–358; Kraetschmer, Lamb, Fostiropoulos and Huffman.

Characterization of the Soluble All-Carbon Molecules C$_{60}$ and C$_{70}$; J. Phys. Chem. 1990, pp. 8630–8633; Ajie, Alvarez, Anz, Beck Diederich, Fostiropoulos, Huffman, Kraetschmer, Rubin, etc. (no mo.).

Isolation, Separation and Characterisation of the Fullerenes C$_{60}$ and C$_{70}$: The Third Form of Carbon; J. Chem. Soc., Chem. Commun. 1990, pp. 1423–1425; Taylor, Hare, Abdul-Sada and Kroto. (no mo.).

Two Different Fullerenes Have the Same Cyclic Voltammetry; J. Am. Chem. Soc. 1991, 113, pp. 1050–1051; Allemand, Koch, etc. (no mo.).

Spectroelectrochemical Study of the C$_{60}$ and C$_{70}$ Fullerenes and Their Mono-, Di-, Tri-, and Tetraanions; J. Am. Chem. Soc., 1991, 113, pp. 4364–4366; Dubois, Kadish, Flanagan, Haufler, Chibante (no mo.).

Electrochemical Detection of Fulleronium and Highly Reduced Fulleride (C$_{60}^{5-}$) Ions in Solution; J. Am. Chem. Soc. 1991, 113, pp. 7773–7774, Dubois, Kadish, Flannagan and Wilson. (no mo.).

(List continued on next page.)

*Primary Examiner*—Janyce Bell
*Attorney, Agent, or Firm*—Flynn, Thiel, Boutell & Tanis

[57] ABSTRACT

A method is provided for forming a fullerene layer on a substrate by chemically treating a surface of the substrate to provide a bond-forming species at the surface effective to covalently bond with fullerenes in solution and contacting the treated substrate surface with a solution of fullerenes to form a fullerene layer covalently bonded to the treated substrate surface. Alternately or in addition, a fullerene layer is formed on a substrate by chemically modifying fullerenes to provide a bond-forming species thereon, chemically treating a surface of the substrate to provide a bond-forming species effective to covalently bond with the bond-forming species of the fullerenes in solution, and contacting a solution of treated fullerenes with the treated substrate surface to form a fullerene layer covalently bonded to the treated substrate surface.

A three dimensional multilayer fullerene structure can be formed on the substrate surface by chemically modifying an initial fullerene layer formed thereon in the manner described above to provide chemical bridging species (e.g. piperazine) covalently bonded thereto and effective to covalently bond with fullerenes in solution. The modified fullerene film then is contacted with a solution of modified or unmodified fullerenes to form a second fullerene layer covalently bonded to the initial fullerene layer by the chemical bridging species. The method can be repeated to build up additional fullerene layers on the substrate surface.

22 Claims, 7 Drawing Sheets

OTHER PUBLICATIONS

Electrochemical Detection of $C_{60}^{6-}$ and $C_{70}^{6-}$: Enhanced Stability of Fullerides in Solution; J. Am. Chem. Soc. 1992, 114, pp. 3978–3980; Xie, Perez-Cordero and Echegoyen. (no mo.).

Electrochemical detection of $C_{60}^{6-}$ at Low Temperature J. Chem. Soc., Chem. Commun. 1992, pp. 781–782; Ohsawa and Saji. (no mo.).

Electrochemistry and Langmuir Trough Studies of $C_{60}$ and $C_{70}$ Films: J. Am. Chem. Soc. 1992, 114, 4237–4247; Jehoulet, Obeng, Kim, Zhou and Bard. (no mo.).

Formation of Langmuir-Blodgett Films of a Fullerene; J. Am. Chem. Soc. 1992, pp. 4–6; Nakamura, Tachibana, Yumura, Matsumoto, Azumi, Tanaka and Kawabata. (no mo.).

Langmuir Films of $C_{60}$ At the Air-Water Interface; J. Am. Chem. Soc. 1991, 113, pp. 6279–6280; Obeng and Bard. (no mo.).

Electrochemical Reduction and Oxidation of $C_{60}$ Films; J. Am. Chem. Soc. 1991, 113, pp. 5456–5457; Jehoulet and Bard. (no mo.).

Superconductivity of 18K in potassium-doped $C_{60}$; Nature, vol. 350, Apr. 18, 1991, pp. 600–601; Hebard, Rosseinsky; Haddon, Murphy, Glarum, Palstra, Ramirez and Kortan.

$(Rb_xK_{1-x})_3C_{60}$ Superconductors; Formation of a Continuous Series of Solid Solutions; Science, vol. 253, pp. 886–888; Chen, Kelty and Lieber. (no date).

Superconductivity at 45 K in Rb/T1 Codoped $C_{60}$ and $C_{60}/C_{70}$ Mixtures; Science, vol. 254, pp. 826–829; Iqbal, Baughman, Ramakrishna, Khare, Murphy, Bornemman and Morirs. (no date).

Superconductivity at 8.4 K in calcium-doped $C_{60}$; Nature, vol. 355, Feb. 6, 1992, pp. 529–531; Kortan, Kopylov, Glarum, Gyorgy, Ramirez, Fleming, Thiel and Haddon.

Preparation and structure of the alkali-metal fulleride $A_4C_{60}$; Nature, vol. 352, Aug. 22, 1991, pp. 701–703; Fleming, Rosseinsky, Ramirez, Murphy, Tully, Haddon, Siegrist, Tycko, etc.

Large second-harmonic response of $C_{60}$ thin films; App. Phys. Lett. 60 (7), Feb. 17, 1992, pp. 810–812; Wang, Zhang, Lin, Liu, Wong, Kappes, Chang and Ketterson.

Penetration-Controlled Reactions in Organized Monolayer Assemblies. 1. Aqueous Permanganate Interaction with Monolayer and Multilayer Films of Long-Chain Surfactants; Langmuir, 1987, 3, pp. 1034–1044; Maoz and Sagiv. (no mo.).

Penetration-Controlled Reactions in Organized Monolayer Assemblies. 2. Aqueous Permanganate Interaction with Self-Assembling Monolayers of Long-Chain Surfactants; Langmuir 1987, 3, pp. 1045–1051; Maoz and Sagiv. (no mo.).

Incorporation of Phenoxy Groups in Self-Assembled Monolayers of Trichlorosilane Derivatives; Effects on Film Thickness, Wettability, and Molecular Orientation; J. Am. Chem. Soc. 1988, 110, pp. 6136–6144; Tillman, Ulman, Schidkraut and Penner. (no mo.).

Formation of Multilayers by Self-Assembly; Langmuir, 1989, 5, pp. 101–111; Tillman, Ulman and Penner. (no mo.).

Electrochemistry at the Water/Air Interface. Lateral Electron Transport in Langmuir Monolayers; J. Am. Chem. Soc. 1988, 110, pp. 2009–2011; Widrig, Miller and Majda. (no mo.).

Ionic Interactions Play a Major Role in Determining the Electrochemical Behavior of Self-Assembling Viologen Monolayers; Langmuir 1990, 6, pp. 1319–1322; De Long and Buttry. (no mo.).

Electrochemistry of Chemisorbed Molecules. I. Reactants Connected to Electrodes through Olefinic Substituents; J. Phys. Chem. vol. 77, No. 11, 1973, pp. 1401–1410; Lane and Hubbard. (no mo.).

Metal Complexes of Buckminsterfullerence ($C_{60}$); Acc. Chem. Res. 1992, 25, pp. 134–142; Fagan, Calabrese and Malone. (no mo.).

The Chemical Properties of Buckminsterfullerence ($C_{60}$) and the Birth and Infancy of Fulleroids; Acc. Chem. Res. 1992, 25, pp. 157–161; Wudl. (no mo.).

Globe-trotting Hydrogens on the Surface of the Fullerence Compound $C_{60}H_6(N(CH_2CH_2)_2O)_6$; Angew. Chem. Int. Ed. Engl. 30 (1990) No. 10, pp. 1309–1310; Hirsch, Li and Wudl. (no mo.).

Reaction of $C_{60}$ with Dimethyldioxirane-Formation of an Epoxide and a 1,3-Dioxolane Derivative; Angew, Chem. Int. Ed. Engl. 31 (1992) No. 3, pp. 351–353; Elemes, Silverman, Sheu, Kao, etc. (no mo.).

(List continued on next page.)

OTHER PUBLICATIONS

Accumulating Evidence for the Selective Reactivity of the 6–6 Ring Fusion of $C_{60}$. Preparation of Structure of $(\eta^2\text{-}C_{60})$ Ir(CO)Cl)PPh$_3$)$_2$–5C$_6$H$_6$; Inorg. Chem. 1991, 30, pp. 3980–3981. (no mo.).

$(\eta^2\text{-}C_{70})$ Ir(CO)Cl(PPh$_3$)$_2$: The Synthesis and Structure of an Organometallic Derivative of a Higher Fullerene; J. Am. Chem. Soc. 1991, 113, pp. 8953–8955; Balch, Catalano, Lee, Olmstead. (no mo.).

Organic Chemistry of $C_{60}$ (Buckminsterfullerence): Chromatography and Osmylation; J. Org. Chem. 1990, pp. 6250–6262; Hawkins, Lewis, Loren, Meyer, Heath, Shibato and Saykally. (no mo.).

Systematic Inflation of Buckminsterfullerene $C_{60}$: Synthesis of Diphenyl Fulleroids $C_{61}$ to $C_{66}$; Science, vol. 254, pp. 1186–1188 Suzuki, Li, Khemain, Wudl, and Almarsson. (no date).

Organometallic Chemistry with Buckmnsterfullerene. Preparation and Properties of an Indenyliridium (I) Complex; J. Am. Chem. Soc. 1991, 113, pp. 8957–8958; Koefod, Hudgens and Shapley (no mo.).

Crystal Structure of Osmylated $C_{60}$: Confirmation of the Soccer Ball Framework; Science, vol. 252, pp. 312–313; Hawkins, Meyer, Lewis, Loren, Hollander. (no date).

Covalently Attached Organic Monolayers on Semiconductor Surfaces; J. Am. Chem. Soc. 1978, 100, pp. 8050–8055; Haller. (no mo.).

Chemically Modified Tin Oxide Electrode; Chemistry, vol. 47, Oct. 12, 1975, pp. 1882–1886; Moses, Wier, Murray.

Formation of Monolayer Films by the Spontaneous Assembly of Organic Thiols from Solution onto Gold; J. A. Chem. Soc. 1989, 111, pp. 321–334; Bain, Throughton, Tao, Evall, Whitesides, etc. (no mo.).

The Structure of the $C_{60}$ Molecule: X–Ray Crystal Structure Determination of a Twin at 110 K; Science, vo. 254, pp. 408–410; Liu, Lu, Kappes and Ibers. (no date).

Modeling Organic Surfaces with Self–Assembled Monolayers; Angew, Chem. Int. Ed. Engl. 28 (1989) No. 4, pp. 506–512; Bain and Whitesides. (no mo.).

A Simple Sozhlet Chrmatographic Method for the Isolation of Pure $C_{60}$ and $C_{70}$; J. Org. Chem. 1992, 57, pp. 3254–3256; Khemani, Prato and Wudl. (no mo.).

Electrochemical Applications of the Quartz Crystal Microbalance; Anal. Chem. Vol. 61, No. 20, Oct. 15,1989, pp. 1147–1154; Deakin and Buttry.

Homogeneous Catalysis of Hydrosilation by Transition Metals; Adv. Org. Chem., vol. 17, pp. 407–447; Speier. (no date).

Photoelectrochemical Behaviour of $C_{60}$ Films; J. Am. Chem. Soc. 1991, 113, pp. 6291–6293; Miller, Rosamilia, Dabbagh, Tycko, Haddon, Muller, Wilson, Murphy and Hebard. (no mo.).

Luminescence and Absorption Spectra of $C_{60}$ Films; J. Phys. Chem. 1991, 95, pp. 2127–2129; Reber, Yee, McKiernan, Zink, Williams, Tong, Ohlberg, Whetten, and Diederich. (no mo.).

Immobilization of Monomolecular Layers on Electrodes; <<Molecular Design of Electrode Surfaces>>, pp. 12–21; Edited by Royce Murray. (no date).

A quartz crystal microbalance analysis of ion insertion into $WO_3$; Solar Energy Mat. 25 (1992) pp. 269–291; Babinec. (no no.).

METHOD OF FORMING SELF-ASSEMBLED, MONO- AND MULTI-LAYER FULLERENE FILM AND COATED SUBSTRATES PRODUCED THEREBY

FIELD OF THE INVENTION

The present invention relates to the formation (self-assembly) of covalently bound mono- and multilayered fullerene films or layers on insulating, semiconducting, and metallic substrates.

BACKGROUND OF THE INVENTION

Physisorbed, multilayer films of the fullerene $C_{60}$ have exhibited interesting mechanical, electrical, electrochemical, and optical properties. Such physisorbed fullerene films have been formed on substrates by the well known Langmuir-Blodgett (LB) technique and by the solution evaporation technique using $C_{60}$ solutions (e.g. $C_{60}$ dissolved in non-polar organic solvents such as benzene, toluene, etc.). Such physisorbed films also have been formed by thermal evaporation of solid phase fullerenes onto a suitable substrate.

However, in order to exploit the potentially useful properties of fullerene films, there is a need for a method of forming covalently bound mono- and multilayer film structures of fullerenes on insulating, semiconducting, and metallic substrates.

It is an object of the invention to provide a method of forming monolayer and multilayer fullerene film structures on substrates chemically treated to provide a bond-forming species at the surface for covalently bonding with fullerenes in solution.

It is another object of the invention to provide a method of forming monolayer and multilayer fullerene film structures on substrates from a solution of fullerenes chemically modified to covalently bond with a treated substrate.

It is still another object of the invention to provide substrates having fullerene monolayer and multilayer film structures covalently bonded thereto.

SUMMARY OF THE INVENTION

In accordance with one aspect of the invention, a method is provided for forming a fullerene layer on a substrate by chemically treating a surface of the substrate to provide a bond-forming species at the surface effective to covalently bond with fullerenes in solution and contacting the treated substrate surface with a solution of fullerenes to form a fullerene layer covalently bonded to the treated substrate surface. In one embodiment of the invention, the substrate surface can be treated to provide a bond-forming species that forms carbon-nitrogen bonds with fullerenes in solution. For example, the substrate surface can be treated prior to contacting the solution of fullerenes to provide amine bond-forming species or sites at the treated substrate surface.

Alternately, in another embodiment of the invention, the substrate surface can be treated to provide a bond-forming species that forms a carbon-carbon bond with fullerenes in solution. For example, the substrate surface can be treated prior to contacting the solution of fullerenes to provide alkyl anion species at the treated substrate surface.

In accordance with still another embodiment of the invention, the substrate surface can be treated to provide a bond-forming species that forms a carbon-oxygen bond with fullerenes in solution. For example, the substrate surface can be treated prior to contacting the solution of fullerenes to provide transition metal oxide species at the treated substrate surface.

The fullerenes can be dissolved in a nonpolar organic solvent that is contacted with the treated substrate surface to form the fullerene layer covalently bonded to the treated substrate.

A three dimensional multilayer fullerene structure can be formed on the substrate surface by chemically modifying an initial fullerene layer formed thereon in the manner described above to provide chemical bridging species (e.g. piperazine) covalently bonded thereto and effective to covalently bond with fullerenes in solution. The modified fullerene film then is contacted with a solution of fullerenes to form a second fullerene layer covalently bonded to the initial fullerene layer by the chemical bridging species. The method can be repeated to build up additional fullerene layers on the substrate surface.

In accordance with another aspect of the invention, a method is provided for forming a fullerene layer on a substrate by chemically modifying fullerenes to provide a bond-forming species thereon, chemically treating a surface of the substrate to provide a bond-forming species effective to covalently bond with the bond-forming species of the fullerenes in solution, and contacting a solution of modified fullerenes with the treated substrate surface to form a fullerene layer covalently bonded to the treated substrate surface. For example, in one embodiment of the invention, fullerenes in solution are treated to form hydrosilated fullerenes and the substrate surface is treated to provide hydroxy groups that covalently bond with the hydrosilated fullerenes in solution. The hydrosilated fullerenes can be dissolved in a nonpolar organic solvent that is contacted with a base treated substrate surface to form the fullerene layer covalently bonded to the treated substrate.

A three dimensional multilayer fullerene structure can be formed on the substrate surface by chemically modifying an initial fullerene layer formed thereon in the manner described above to provide chemical bridging species (e.g. piperazine) covalently bonded thereto and effective to covalently bond with modified or unmodified fullerenes in solution and contacting the modified fullerene film with a suitable fullerene solution to form a second fullerene layer covalently bonded to the initial fullerene layer by the chemical bridging species.

The present invention provides in accordance with still another aspect of the invention a fullerene coated substrate having a surface treated to covalently bond with fullerene molecules and a fullerene layer covalently bonded to the treated substrate surface. The fullerene layer can be covalently bonded to the treated substrate surface by carbon-nitrogen, carbon-carbon, carbon-oxygen, and/or carbon-silicon covalent bonds. Additional fullerene layers can be covalently bonded to the fullerene layer by chemical bridging species to form multilayer fullerene structures.

The present invention also provides novel layers of fullerenes.

The aforementioned and other objects and advantages of the present invention will be better understood from the following detailed description of the invention taken with the following drawings.

DETAILED DESCRIPTION

In accordance with one aspect of the invention, a method is provided for forming a fullerene monolayer on a substrate by chemically treating a surface of the substrate to provide a bond-forming species at the surface effective to covalently bond with fullerenes in solution. The term "fullerene" as used herein is intended to include $C_{60}$, $C_{70}$, and other solely carbon molecules classified in the fullerene family of molecules.

In one embodiment of the invention, the substrate surface can be treated to provide a bond-forming species that forms covalent bonds with fullerenes in solution.

The following Examples 1-5 are offered to illustrate this embodiment of the invention without intending to limit the invention.

EXAMPLE 1

In this Example, the surface of an indium-tin oxide (ITO) substrate is treated to provide an amine bond-forming chemical species thereon. In particular, a base-treated (treated in 0.5M KOH ethanol/water solution for 3 hours at room temperature) ITO substrate is soaked in a 0.25M benzene solution of $(MeO)_3Si(CH_2)_3NH_2$ under reflux conditions for 8-12 hours. The substrate then is removed and rinsed with benzene, dichloromethane, and acetonitrile in sequence. The decreased hydrophilicity of the treated surface is verified with contact angle measurements (theta=46 degrees) as set forth in Table I below. Such contact angle measurements are commonly used to assess surface composition. A Rame-hart Model A-100 Goniometer was used for all contact angle measurements.

The $(MeO)_3Si(CH_2)_3NH_2$-treated substrate then is soaked in a 1 mM benzene solution of $C_{60}$ for 1-2 days under reflux conditions. The $C_{60}$ dissolved in the benzene solution was obtained by the carbon arc method wherein a 1 inch diameter by 6 inches long graphite rod is arced in a water cooled vacuum arc furnace using about 10% of a 120 KW (400Amp at 300 volts DC) power source. The 1 inch diameter by 6 inches long graphite is converted to soot in 15 minutes using this procedure. The $C_{60}$ and $C_{70}$ fullerenes are separated from the soot chromatographically using a SOXHLET extractor with an alumina packed column. This fullerene preparation procedure is described in Nature, Vol. 347, p. 354 (1990), J. Chem. Soc. Chem. Commun., p.1423 (1990), and J. Phys. Chem., Vol. 94, p. 8630 (1990). The fullerenes used in the following Examples were obtained in the same manner.

After soaking in the $C_{60}$ solution for 1-2 days, the substrate is rinsed and sonicated in benzene for 2 minutes to remove residual physisorbed $C_{60}$ and then further rinsed with dichloromethane and tetrahydrofuran (THF). The relative hydrophobicity of the resulting $C_{60}$ coated substrate surface is confirmed via contact angle measurements, theta=72 degrees, Table I.

TABLE I

| Contact Angles For $H_2O$ | |
|---|---|
| Surface | Contact Angle (theta) |
| Base-treated ITO | 20 degrees |
| $(MeO)_3Si(CH_2)_3NH_2$-treated ITO | 46 degrees |
| $C_{60}$ Monolayer on ITO | 72 degrees |
| $HN(CH_3)CH_2CH_3$ | 63 degrees |
| $H_2N(CH_2)_2CH_3$ | 60 degrees |
| $NH(CH_3)CH_2CH_2OH$ | 42 degrees |
| p-ferrocenylaniline | 67 degrees |

Quartz and glass substrate surfaces can be coated with $C_{60}$ in a similar manner as described for the ITO substrate surface.

Figure 1A:
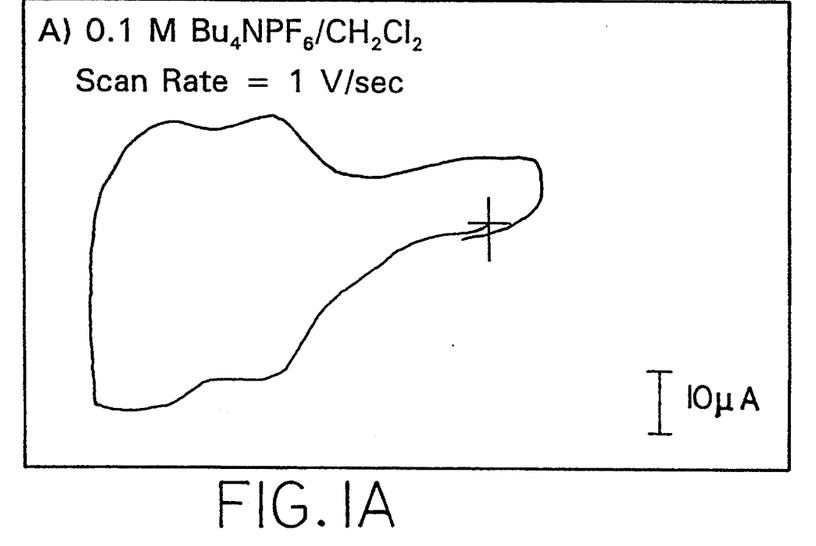
FIG. 1A is a cyclic voltammogram for a self assembled $C_{60}$ monolayer on $(MeO)_3Si(CH_2)_3NH_2$-treated indium-tin oxide (ITO) electrode (0.5 cm$^2$) in $CH_2Cl_2/0.1M$ $Bu_4NPF_6$.

The cyclic voltammetry of a $(MeO)_3Si(CH_2)_3NH_2$-treated ITO substrate (electrode) coated with $C_{60}$ in the manner described above yields the electrochemical response in $CH_2Cl_2/0.1M$ $Bu_4NPF_6$ as shown in FIG. 1A. The $E_{\frac{1}{2}}$ values for the reductive waves ($-1.14$ and $-1.51V$ versus ferrocene/ferrocinium, Fc/Fc+, reference potential taken with an ITO working electrode) observed in FIG. 1A are substantially more negative than the $E_{\frac{1}{2}}$'s for the first two reductions for unmodified $C_{60}$ in solution ($-0.98$ and $-1.38V$ versus Fc/Fc+ as taken with an ITO working electrode), the cyclic voltammetry of $C_{60}$ in solution being well known as set forth in J. Am. Chem. Soc., Vol. 113, p. 7773 (1991), J. Am. Chem. Soc., Vol. 113, p. 4364 (1991), J. Am. Chem. Soc., Vol. 113, p. 1050 (1991), and J. Am. Chem. Soc., Vol. 114, p. 3978 (1992) and exhibiting three electrochemically reversible reduction waves in the potential window between 0 and $-1.9V$ versus Fc/Fc+.

These observed voltage shifts of $-0.16V$ and $-0.13V$, respectively, for the $C_{60}$ layer are consistent with the carbon-nitrogen bond forming reaction between the self-assembled $C_{60}$ molecules and the underlying amine bond-forming sites. That is, the shift in $E_{\frac{1}{2}}$ values for the $C_{60}$ layer when compared with $C_{60}$ in solution is consistent with a covalent carbon-nitrogen bond-forming reaction between $C_{60}$ and the surface amine sites as depicted in FIG. 1C.

The resolution of the waves of FIG. 1A reflect the homogeneity of the surface fullerene species and suggests that each fullerene in the layer has a similar chemical identity, mono- and/or di-substituted adducts. Assuming each wave in FIG. 1A corresponds to a one electron transfer, integration of the current associated with the waves is consistent with monolayer coverage of the substrate surface (e.g. approximately $1.7 \times 10^{-10}$ mol/cm$^2$). Models based on crystallographic data for $C_{60}$ predict a surface coverage of approximately $1.9 \times 10^{-10}$ mol/cm$^2$ for a closed packed monolayer of $C_{60}$.

Importantly, the $C_{60}$ layer formed in the manner described above can be chemically modified by reaction with a variety of amine reagents to build up multilayer $C_{60}$ film structures. For example, referring to FIG. 1C, the steps shown can be repeated to build up a multilayer $C_{60}$ structure wherein $C_{60}$ layers are covalently bonded via piperazine bridging species (providing covalent carbon-nitrogen bonds) in the manner shown in FIG. 1C. The number of $C_{60}$ layers formed on the substrate surface can be controlled by the number of times that the steps of FIG. 1C are repeated.

In particular, the $C_{60}$ layer formed in the manner described above can be modified by reaction with amine reagents shown in Table I above. There is excellent correlation with the type of amine reacted with the $C_{60}$ layer and the expected wettability of the surface obtained from such a reaction. For example, ethylmethylamine reacted with the $C_{60}$ layer yields a surface with a contact angle of 63 degrees, while 2-(methylamino)ethanol reactant yields a relatively hydrophilic surface (theta=42 degrees) because of its pendant alcohol functionality.

Figure 1B:
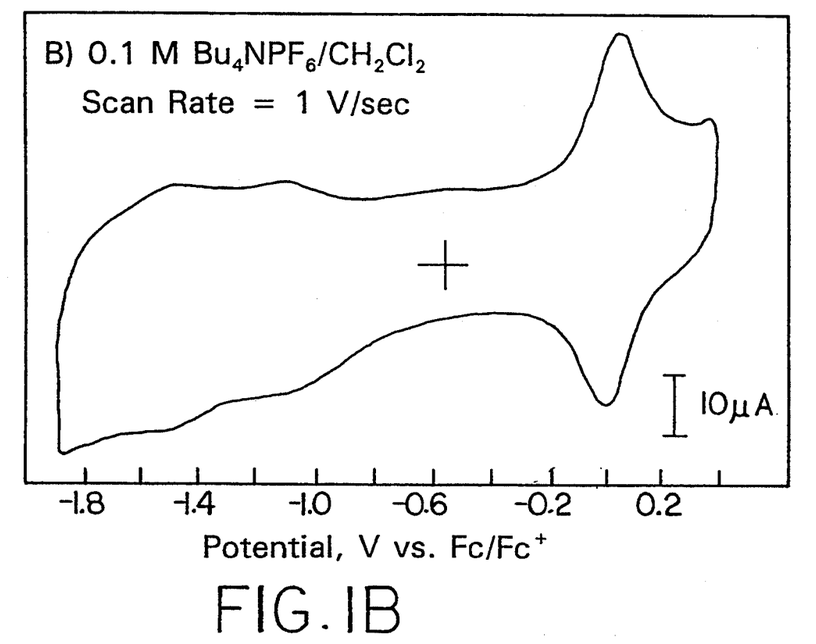
FIG. 1B is a cyclic voltammogram for a self-assembled $C_{60}$ monolayer on $(MeO)_3Si (CH_2)_3NH_2$-treated indium-tin oxide (ITO) electrode (0.8 cm$^2$) in $CH_2Cl_2/0.1M$ $Bu_4NPF_6$ after refluxing in a 5 mM benzene solution of para-ferrocenylaniline for 2 days.
Figure 1C:
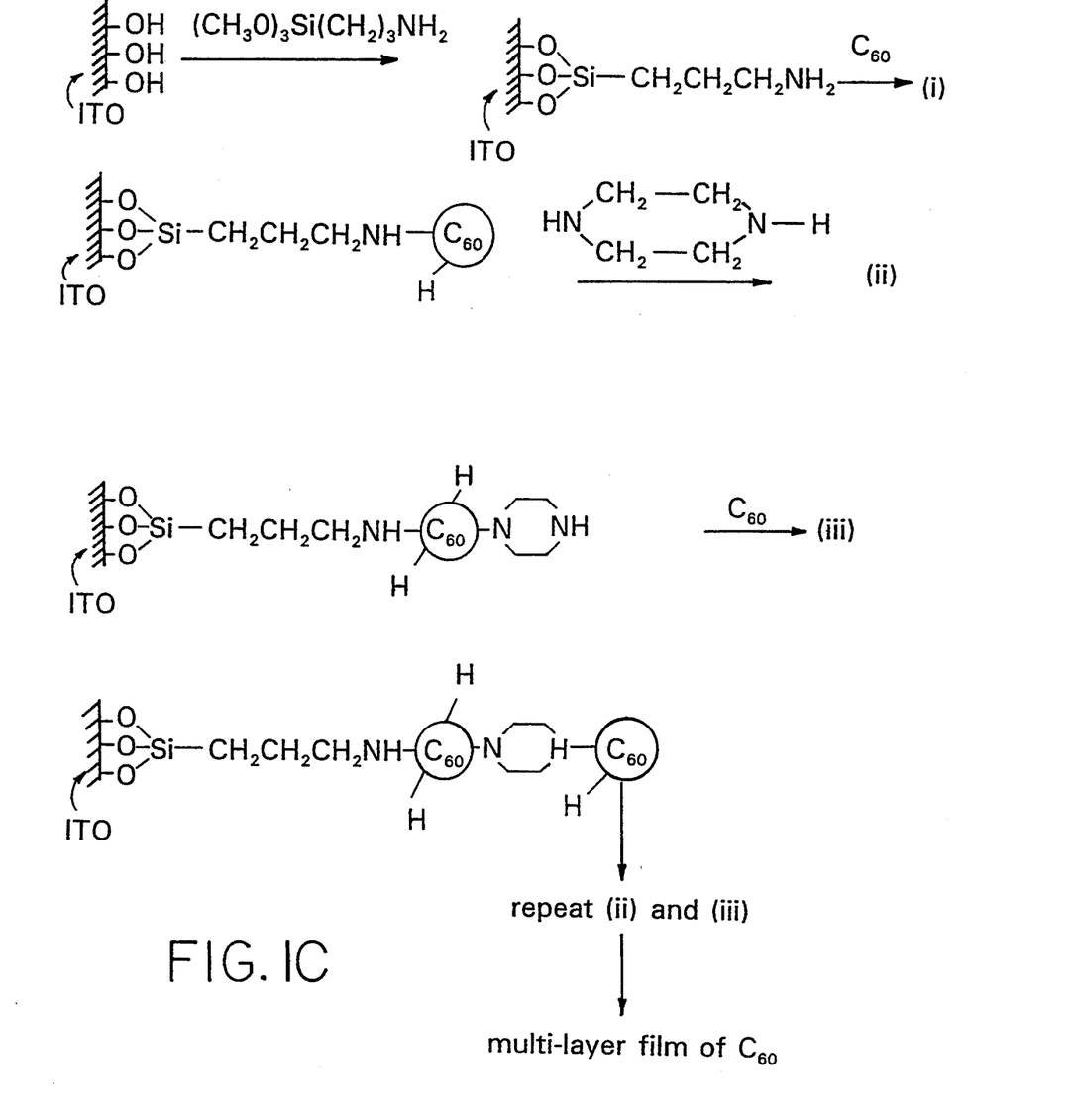
FIG. 1C illustrates a synthesis procedure for self-assembling $C_{60}$ on an amine-modified oxide substrate surface through carbon-nitrogen bond formation.

Reaction of the $C_{60}$ monolayer with para-ferrocenylaniline yields a hydrophobic surface (theta=67 degrees) with redox activity associated with the pendant ferrocene, FIG. 1B. The cyclic voltammetry of a $C_{60}$ layer formed on the aforementioned amine-treated ITO substrate surface after reaction with para-ferrocenylaniline shows reductive waves ($E_{\frac{1}{2}}$'s = $-1.16$V and $-1.56$V vs. Fc/Fc+) expected for materials containing $C_{60}$ as well as an additional wave which is assigned to ferrocene oxidation ($E_{\frac{1}{2}}=0.04$V vs. Fc/Fc+). The surface coverage of the para-ferrocenyl aniline layer is $1.2 \times 10^{-10}$ mol/cm$^2$ as determined by integration of the current assigned to ferrocene oxidation, FIG. 1B. The $E_{\frac{1}{2}}$ value for the adsorbed para-ferrocenylaniline is 0.10 V more positive than the $E_{\frac{1}{2}}$ for para-ferrocylaniline in solution ($-0.06$V vs. Fc/Fc+). This shows that the NH$_2$ of para-ferrocenylaniline has reacted with $C_{60}$ and the shift in $E_{\frac{1}{2}}$ to more positive values reflects the electron withdrawing nature of $C_{60}$.

The para-ferrocenylaniline-$C_{60}$ bilayer films are indefinitely stable to cycling through ferrocene oxidation, but these bi-layer films lose electrochemical activity when held at negative potentials ($-1.8$V) for extended periods of time. X-ray photoelectron spectroscopy (XPS) before and after electrochemical cycling of these bi-layer films confirm removal of the ferrocenylaniline and $C_{60}$ layers from the substrate (electrode) surface. This is done by comparing the XPS lines of (C1s), N(1s), and Fe(2p) before and after electrochemical removal of fullerenes from the surface. This demonstrates the ability of the invention to adsorb/desorb a portion or all of the fullerene monolayer (i.e. to alter the amount of fullerine present on the substrate) by applying negative potentials to the coated substrate.

EXAMPLE 2

Figure 2A:
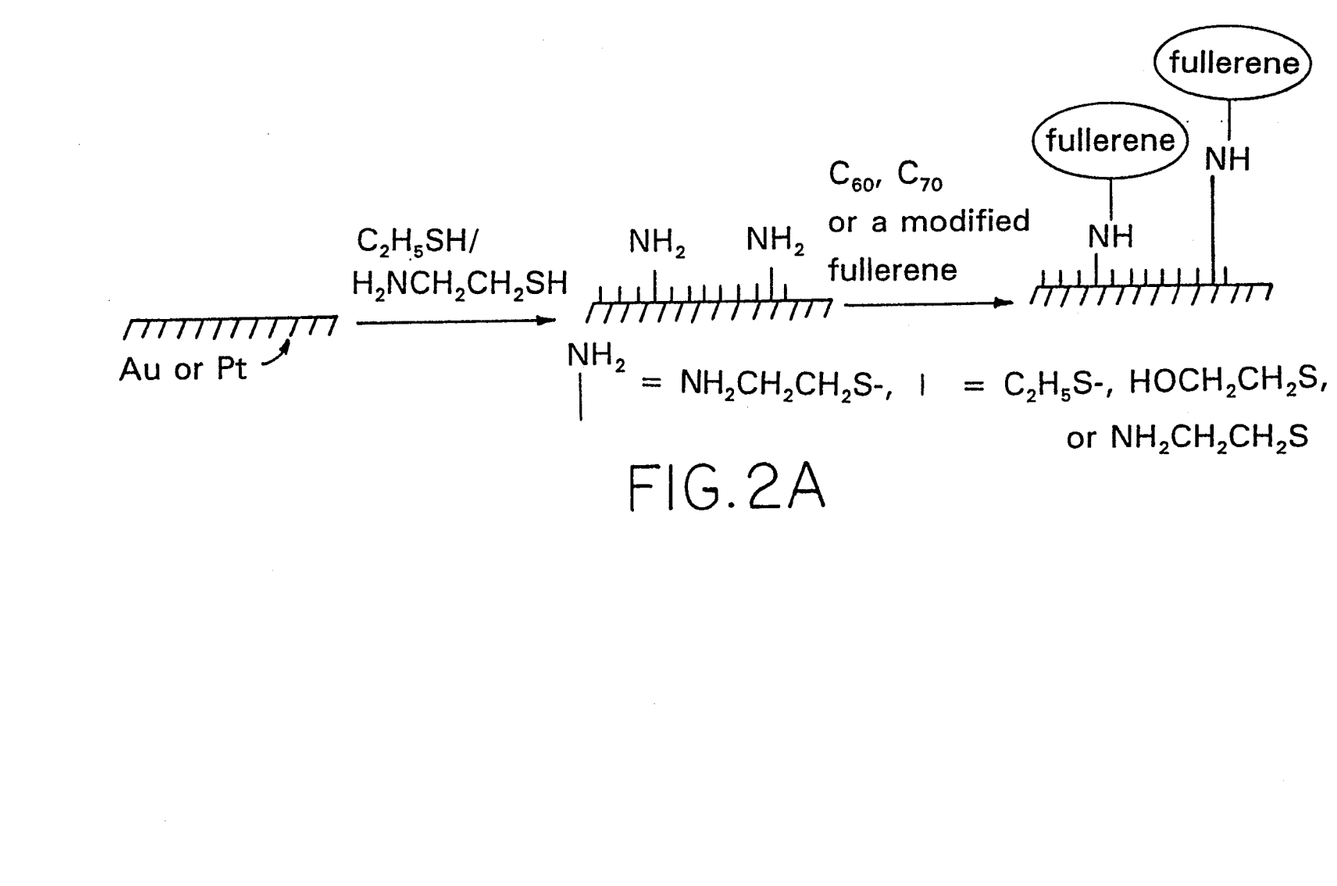
FIG. 2A illustrates another synthesis procedure for self assembling $C_{60}$ on a cysteamine/ethanethiol-modified Au substrate surface through carbon-nitrogen bond formation.

In this Example, the surface of a gold (Au) substrate is treated to provide a preadsorbed monolayer of NH$_2$CH$_2$CH$_2$SH (cysteamine) as depicted in FIG. 2A. In particular, a Au substrate (electrode) is soaked in a 1.0 mM solution of HS(CH$_2$)$_2$NH$_2$ for 24 hours. The resulting substrate is repeatedly rinsed in ethanol, CH$_2$Cl$_2$ and benzene in sequence. The increased hydrophobicity of the resulting substrate surface is confirmed via contact angle measurements, Table II.

TABLE II

| Surface | Contact Angles For H$_2$O |
| --- | --- |
| | Contact Angle (theta) |
| Au | 20 degrees |
| cysteamine-treated Au | 44 degrees |
| C$_{60}$ Monolayer on Au | 65 degrees |

It should be noted that the chemical adsorption of alklythiols onto Au and noble metal substrates in general is a well precedented reaction and that the adsorbates in these reactions are bound to the surface through strong covalent metal-sulfur bonds.

The cysteamine-treated Au substrate then is soaked in a 1 mM toluene solution of C$_{60}$ for 24 hours at room temperature. The resulting substrate is rinsed in benzene and CH$_2$Cl$_2$ to remove physisorbed C$_{60}$. The increased hydrophobicity of the resulting treated surface is confirmed via contact angle measurements.

The electrochemistry of the C$_{60}$ coated Au substrate surface exhibits broad features consistent with a somewhat passivated electrode surface. This is in contrast to monolayers of C$_{60}$ formed in the previous Example 1, which exhibit two distinctive electrochemically reversible reductive waves under similar electrochemical conditions. The broad features appear to be due to the resistance associated with the incorporation of charge compensating ions into the hydrophobic C$_{60}$ monolayer film.

Figure 2B:
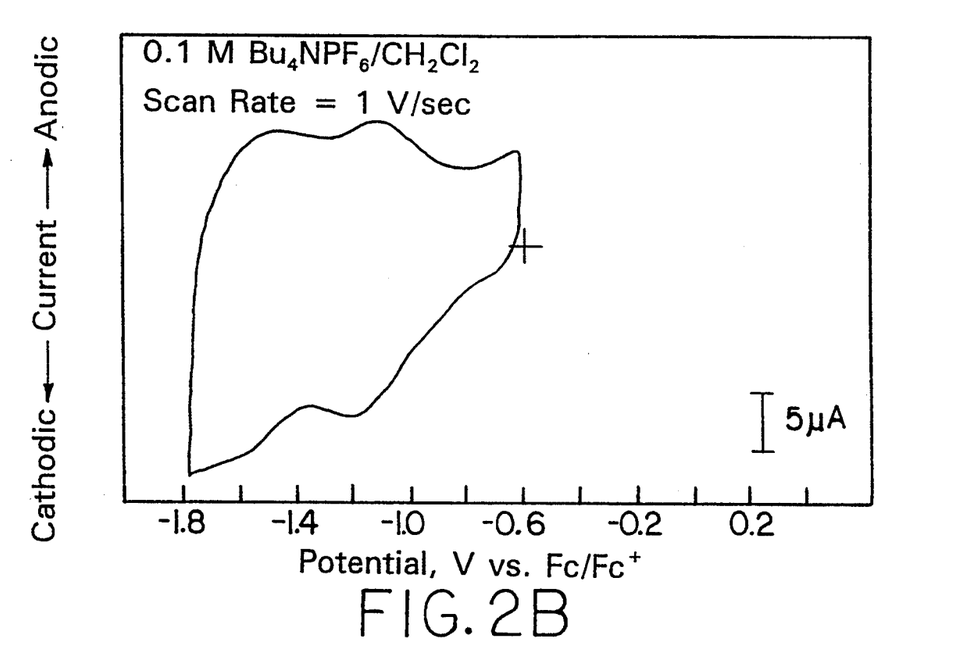
FIGS. 2B and 2C are a cyclic voltammograms for a self assembled $C_{60}$ monolayer on cysteamine/ethanethiol-treated and cysteamine-2-mercaptoethanol treated Au electrodes (0.34 cm$^2$ and 0.56 cm$^2$) in $CH_2Cl_2/0.1M$ $Bu_4NPF_6$.

Referring to FIG. 2B, the adsorption of C$_{60}$ onto a premonolayer formed by soaking in a solution containing 10:1 ethanethiol:cysteamine yields the electrochemical response shown in that Figure. Two reversible waves are observed at $-1.19$V and $-1.57$V versus Fc/Fc+, which are substantially more negative than the $E_{\frac{1}{2}}$'s for the first two reductions for unmodified C$_{60}$ in solution ($-0.98$V and $-1.38$V versus Fc/Fc+). These shifts of $-0.21$V and $-0.19$V, respectively, are consistent with a bond-forming reaction between the self-assembled C$_{60}$ molecules and the underlying amine sites. That is, the shift in $E_{\frac{1}{2}}$ values for the C$_{60}$ layer when compared with C$_{60}$ in solution is consistent with a covalent carbon-nitrogen bond-forming reaction between C$_{60}$ and the surface amine sites as depicted in FIG. 2A.

Assuming each wave in FIG. 2B corresponds to a one electron transfer, integration of the current associated with the waves is consistent with monolayer coverage of the substrate surface (e.g. approximately $1.7 \times 10^{-10}$ mol/cm$^2$).

The incorporation of the ethanethiol into the amine prelayer effectively dilutes the available amine sites on the substrate surface and creates more volume within the subsequently formed $C_{60}$ monolayer that allows for the incorporation of charge compensating ions. It should be noted that a $C_{60}$ monolayer adsorbed onto a prelayer formed from a solution containing 1:1 ethanethiol:cysteamine yields an electrochemical response similar to that for the pure cysteamine prelayers; prelayers formed from solutions containing 50:1 ethanethiol:cysteamine and then treated with $C_{60}$ yield responses similar to FIG. 2B but with lower surface coverages.

A prelayer formed from a solution of 2-mercaptoethanol:cysteamine can also be used to this end.

Figure 2C:
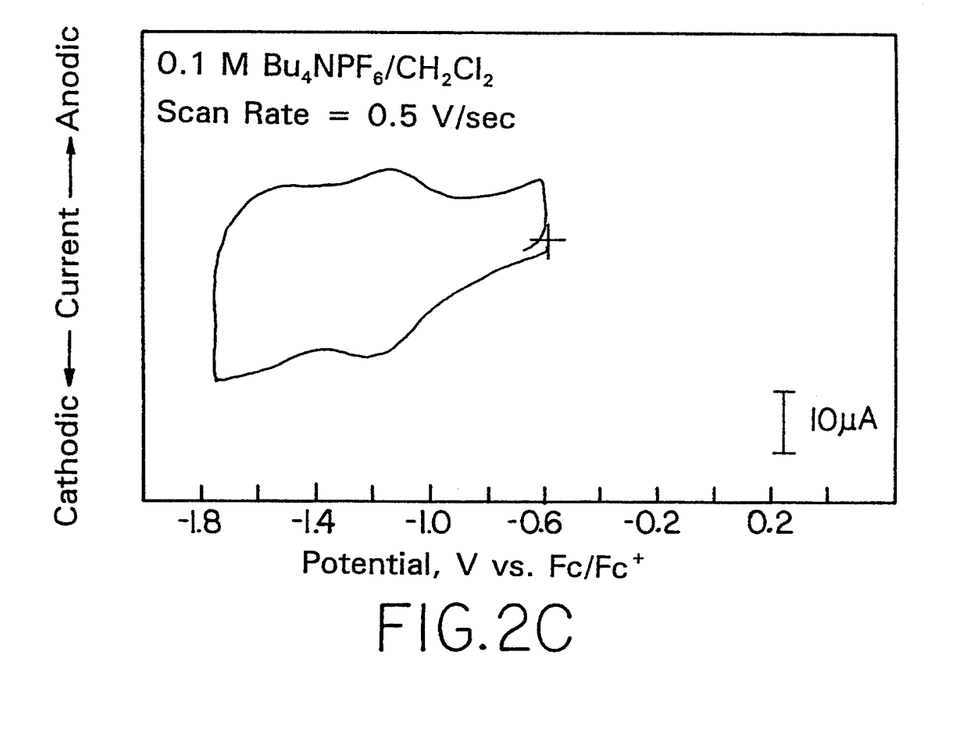

For example, mixed solutions are prepared in different molar ratios of 2-mercaptoethanol and cysteamine. Gold substrates are immersed in these ethanol solutions at room temperature for 24 hours. The substrates are rinsed with ethanol, THF, dichloromethane, and benzene and then immersed in 1 mM benzene solutions of $C_{60}$ for 24 hours. The substrate is rinsed in benzene, THF, and dichloromethane to remove physisorbed $C_{60}$. FIG. 2C shows the cyclic voltammogram obtained from a substrate immersed in a 20:1 molar ratio solution of mercaptoethanol to cysteamine. Two reversible waves are observed at $-1.19$ and $-1.55V$ vs. $Fc/Fc^+$, which are substantially more negative than the $E_{\frac{1}{2}}$ for the first two reductions of unmodified $C_{60}$ in solution ($E_{\frac{1}{2}}$'s = $-0.98V$ and $-1.38V$ vs. $Fc/Fc^+$ using an ITO working electrode). These shifts of $-0.21V$ and $-0.17V$ respectively are consistent with a bond forming reaction between the fullerenes and the underlying amine sites. The shift in $E_{\frac{1}{2}}$ values for the $C_{60}$ layer when compared with $C_{60}$ in solutions is consistent with a covalent bond forming reaction between $C_{60}$ and the surface amine sites.

These results demonstrate that fullerene surface coverage can be controlled pursuant to the invention by choice and ratio of prelayer components. That is, the prelayer can comprise bond-forming species and diluant species (e.g. ethanethiol 2-mercaptoethanol, etc., present in a selected amount to control the amount of fullerene formed on the prelayer upon contact with a solution of fullerenes.

EXAMPLE 3

Figure 3:
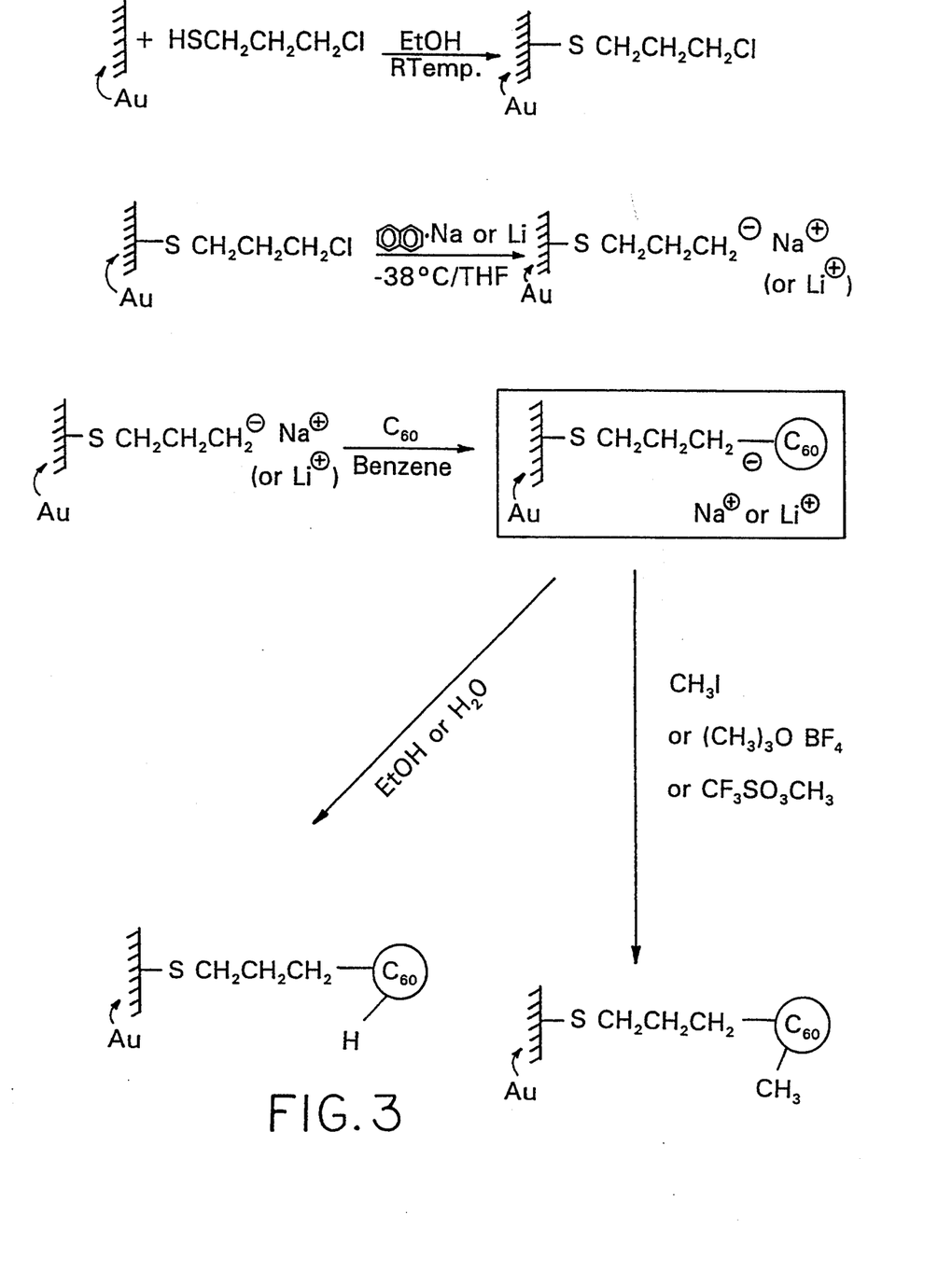
FIG. 3 illustrates a synthesis procedure for self-assembling $C_{60}$ on a chloropropylthiol-modified metal substrate surface through carbon-carbon bond formation.

In this Example, the surface of a Au substrate is treated to provide an alkyl anion bond-forming chemical species thereon as shown in FIG. 3 to form a carbon-carbon bond between the fullerenes and the treated substrate. In particular, an Au electrode is soaked in a 2 mM ethanol solution of chloropropylthiol overnight at ambient temperature. The treated substrate surface is rinsed with ethanol and tetrahydrofuran. The treated substrate surface is then soaked in a 5 mM tetrahydrofuran solution of sodium naphthalide (or lithium naphthalide) at $-38$ degrees C. for 1 hour under a nitrogen atmosphere. After rinsing with tetrahydrofuran and benzene in sequence, the substrate is soaked in a 1 mM benzene solution of $C_{60}$ for 2 hours at ambient temperature in a nitrogen atmosphere. The $C_{60}$ coated Au substrate is rinsed vigorously with benzene and tetrahydrofuran in sequence. The anionic self-assembled monolayer of $C_{60}$ yields an electrochemical response that is indicative of surface confined anionic $C_{60}$ species ($E_{\frac{1}{2}}$'s = $-1.51V$ and $-2.08$ V versus $Fc/Fc+$). The anionic self-assembled monolayers of $C_{60}$ can be quenched with a variety of reagents, such as $CH_3CH_2OH$, $H_2O$, $CH_3I$, $(CH_3)_3OBF_4$, and $CF_3SO_3CH_3$ to form neutral $C_{60}$ monolayers. These $C_{60}$ monolayer films also has been characterized by XPS (XPS lines S(2p), Cl(2p), and C(1s) are compared before and after $C_{60}$ self-assembly).

EXAMPLE 4

Figure 4:
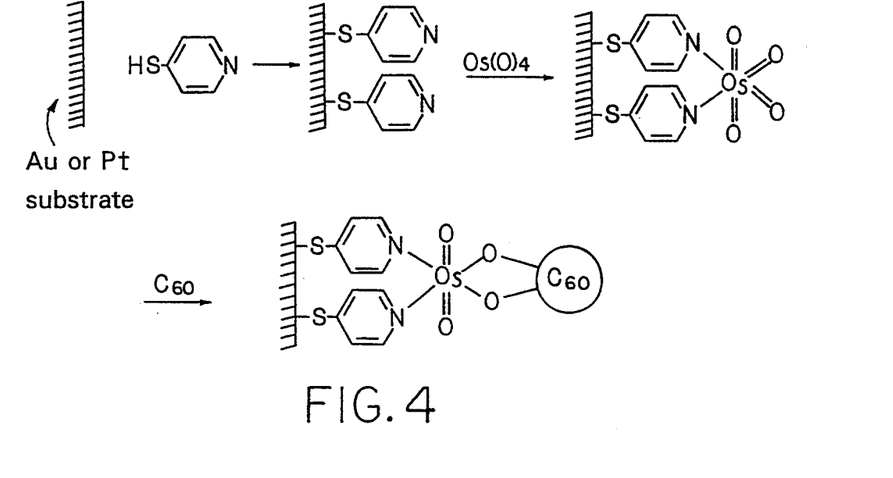
FIG. 4 illustrates a synthesis procedure for self-assembling $C_{60}$ on a transition metal oxide-modified metal substrate surface through carbon-oxygen bond formation.

In this Example, the surface of a Au (or Pt) substrate is treated to provide transition metal oxide bond-forming species in the manner illustrated in FIG. 4 and described below. This effects a carbon-oxygen covalent bonding between the fullerenes and the treated substrate. In particular, a Au substrate is exposed to a 5 mM solution of 4-mercaptopyridine in absolute ethanol for 24 hours. This treated substrate is removed and rinsed with ethanol, benzene, and dichloromethane in sequence. The substrate then is placed in a 1 mM solution of osmium tetroxide in toluene in a dry box for 24 hours. The treated substrate is removed and rinsed with toluene, tetrahydrofuran and dichloromethane in sequence. Finally, the substrate is exposed to a 1 mM solution of $C_{60}$ in toluene for 24 hours. The substrate is removed and rinsed with toluene and dichloromethane in sequence.

XPS confirms the presence of a $C_{60}$ monolayer on the treated substrate. The C(1s), Os(4f) ratio increases upon $C_{60}$ self-assembly. The cyclic voltammogram (not shown) of the coated substrate shows very broad, weak waves associated with sequential one electron reductions of the fullerenes.

Through reduction of $OsO_4$ with alkenes, vinyl ferrocene can be self-assembled by soaking an osmium covered substrate in a 5 mM solution of vinylferrocene. The cyclic voltammogram of this substrate surface exhibits a reversible wave associated with ferrocene oxidation.

Another aspect of the invention involves chemically treating fullerenes in solution to provide a bond-forming species thereon and chemically treating the substrate surface to provide a bond-forming species effective to covalently bond with the bond-forming species of the fullerenes in solution.

EXAMPLE 5

Figure 5A:
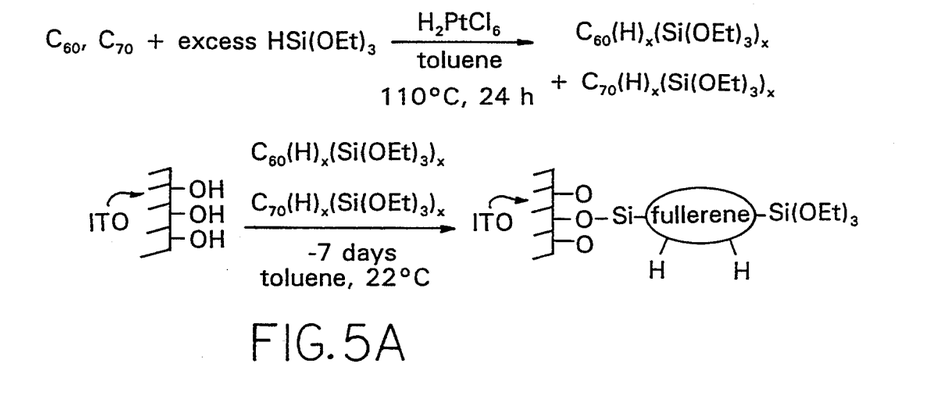
FIG. 5A illustrates a synthesis procedure for self assembling modified $C_{60}/C_{70}$ fullerenes on a base-treated substrate surface through carbon-silicon bond formation.

In this Example, fullerenes in solution are hydrosilated through the $H_2PtCl_6$ catalyzed hydrosilation of $C_{60}$ and/or $C_{70}$ with triethoxysilane, $HSi(OEt)_3$ where Et is ethyl and the hydrosilated $C_{60}$ and/or $C_{70}$ are self-assembled on a base-treated substrate surface as illustrated in FIG. 5A. In particular, $C_{60}$ (30 mgrams, 0.042 mmol) and excess $HSi(OEt)_3$ (1.125 mmol) in toluene at 110 degrees C. for 24 hours in the presence of catalytic quantities (0.1 mgram) of $H_2PtCl_6$ yields a red solution. The mixture is filtered, and the toluene is removed from the filtrate by vacuum distillation. The resulting brown residue is washed with pentane and ether to remove excess silane. By HPLC high pressure liquid chromatography and UV-vis spectroscopy, the residue contains predominantly $C_{60}$ and also significant amounts of hydrosilated fullerene derivatives; namely, $C_{60}H_x(Si(OEt)_3)_x$ where x is 1 to 6. The HPLC equipment uses a Vydac reversed phase column, 4.6 mm $\times$ 25 cm, The Separations Group, 17434 Mojave St., Hesperia, Calif. The HPLC conditions are $(CH_2Cl_2)C_{60}$, tRs = 3.17 minute; hydrosilated mixture: $C_{60}H_x(Si(OEt)_3)_x$ and $C_{60}$, tRs = 1.44, 1.60, 1.74, 1.97, 2.11, 2.27, 2.57, and 3.17 minutes, indicating seven hydrosilated fullerene species present. Spectroscopic and electrochemical data for these solution species are consistent with the $C_{60}H_x(Si(OEt)_3)_x$ formulation. The 1H NMR (nuclear magnetic resonance) of the mixture is consistent with Si-H addition to the $C_{60}$ cage.

Figure 5B:
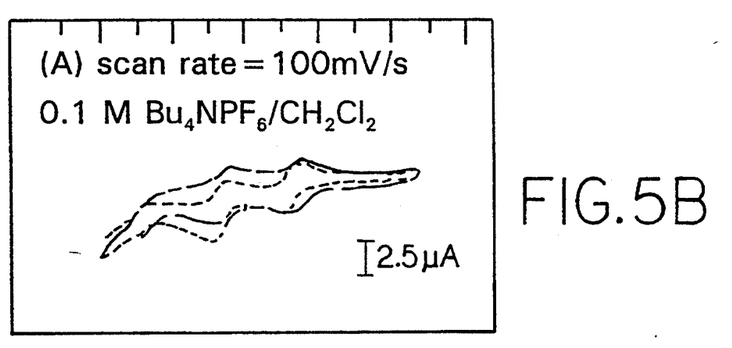
FIGS. 5B, 5C, and 5D are cyclic voltammograms for hydrosilated $C_{60}$ in solution (FIG. 5B), hydrosilated $C_{60}/C_{70}$ in solution (FIG. 5C), and a self-assembled hydrosilated $C_{60}$ monolayer (FIG. 5D) on base-treated indium-tin oxide (ITO) electrode (0.25 cm$^2$) in $CH_2Cl_2/0.1M$ $Bu_4PF_6$.

The cyclic voltammetry of the hydrosilated mixture containing $C_{60}$ and $C_{60}H_x(Si(OEt)_3)_x$ exhibits multiple electrochemically reversible reductions in the potential window observed for $C_{60}$ in solution (i.e. 0V to $-1.9$V versus Fc/Fc+) in addition to those expected for $C_{60}$ as shown in FIG. 5B (solid line). The waves assigned to $C_{60}$ and $C_{60}H_x(Si(OEt)_3)_x$ overlap each other to yield a cyclic voltammogram with substantially broader waves than those observed for pure $C_{60}$ in solution, FIG. 5B (dashed line). Because of the difficulty in separating macroscopic quantities of the $C_{60}H_x(Si(OEt)_3)_x$ derivatives from the unreacted $C_{60}$, it is difficult to obtain definitive structural data. Presumably, the hydrosilation (i.e. Si-H addition) occurs across the carbon-carbon bonds between two fused six membered rings in the fullerene structure.

Figure 5C:
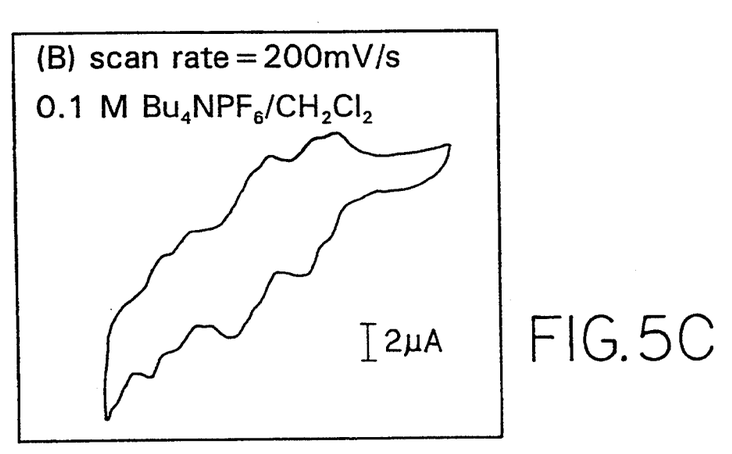

Hydrosilation of a 9:1 mixture of $C_{60}$ and $C_{70}$ under the conditions described above yielded a mixture exhibiting different electrochemistry. For example, the voltammogram showed six discernible reversible reductions, FIG. 5C, indicating hydrosilation of the fullerenes. Three of the waves are undoubtedly due to unreacted $C_{60}$ (Epc$=-1.0, -1.4, -1.9$V versus Fc/Fc+) but the three remaining waves appear to relate to the $C_{60}H_x(Si(OEt)_3)_x$ and $C_{70}H_x(Si(OEt)_3)_x$. Although the cyclic voltammetry of $C_{60}$ and $C_{70}$ in solution are known to be quite similar, the cyclic voltammetry of hydrosilated $C_{60}$ and hydrosilated $C_{70}$ are quite different, FIG. 5B (solid line) and FIG. 5C. HPLC studies of the hydrosilated mixture indicates nine new compounds, $C_{60}H_x(Si(OEt)_3)_x$ and $C_{70}H_x(Si(OEt)_3)_x$ derivatives.

Importantly, the hydrosilated $C_{60}$ and $C_{70}$ self-assemble into redox active thin films on ITO substrate surfaces. In particular, an ITO substrate is soaked in a 0.5M KOH solution (EtOH/$H_2O$) for three hours and then removed and rinsed with distilled water and ethanol in sequence. The base-treated substrate is dried at 22 degrees C. under vacuum. The base-treated substrate then is soaked in a toluene solution containing the hydrosilated fullerenes for seven days at 22 degrees C. under a nitrogen atmosphere. The substrate is removed and rinsed with toluene, acetonitrile and dichloromethane in sequence. The transmission UV-vis spectrum of the coated substrate exhibits broad bands that are characteristic of modified $C_{60}$ and $C_{70}$ compounds. The cyclic voltammetry of the self-assembled $C_{60}$ and $C_{70}$ film on the substrate yields a response shown in FIG. 5D (solid line). Very broad but persistent waves are observed in the potential window between 0V and $-1.6$V versus Fc/Fc+. Assuming two one electron transfer processes in the potential region between 0V and $-1.6$V (modified forms of $C_{60}$ typically have redox couples slightly more negative than that of pure $C_{60}$), integration of the current associated with these waves is consistent with monolayer coverage ($1.3 \times 10^{-10}$ mols/cm$^2$).

Figure 5D:
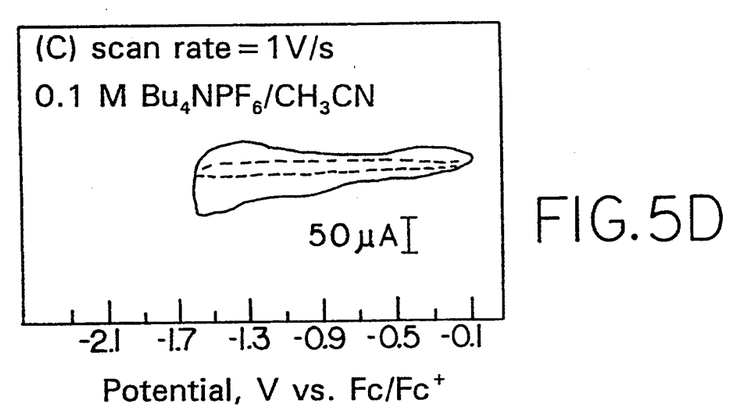

Scanning to more negative potentials ($-2.1$V) indicates additional redox activity for the fullerene film, but after one scan results in complete loss of electrochemical activity, FIG. 5D (dashed line).

Quartz and glass may be coated with hydrosilated fullerene films in a manner similar to that described above.

While the invention has been described in terms of specific embodiments thereof, it is not intended to be limited thereto but rather only to the extent set forth hereafter in the following claims.

The embodiments of the invention in which an exclusive property or privilege is claimed are defined as follows:

1. A method of forming a fullerene layer on a substrate, comprising chemically modifying a surface of the substrate to provide bond-forming species at the surface effective to covalently bond with fullerenes in solution, and contacting the treated substrate with a solution of fullerenes to form a fullerene layer covalently bonded to the chemically modified substrate surface.

2. The method of claim 1 wherein the substrate surface is chemically modified to provide bond-forming species that form carbon-nitrogen covalent bonds with fullerenes in solution.

3. The method of claim 2 wherein the substrate surface is chemically modified prior to contacting the solution of fullerenes to provide amine bond-forming species at the chemically modified substrate surface.

4. The method of claim 1 wherein the substrate surface is chemically modified to provide bond-forming species that form carbon-carbon covalent bonds with fullerenes in solution.

5. The method of claim 4 wherein the substrate surface is chemically modified prior to contacting the solution of fullerenes to provide alkyl anion bond-forming species at the chemically modified substrate surface.

6. The method of claim 1 wherein the substrate surface is chemically modified to provide bond-forming species that form carbon-oxygen covalent bonds with fullerenes in solution.

7. The method of claim 6 wherein the substrate surface is chemically modified prior to contacting the solution of fullerenes to provide mercaptopyridine-$OsO_4$ bond-forming species at the chemically modified substrate surface.

8. The method of claim 1 wherein a solution of $C_{60}$ dissolved in a organic solvent is contacted with the chemically modified substrate surface.

9. A method of forming a multilayer fullerene film on a substrate, comprising chemically modifying a surface of the substrate to provide bond-forming species at the surface effective to covalently bond with fullerenes in solution, contacting the chemically modified substrate with a solution of fullerenes to form a first fullerene layer covalently bonded to the chemically modified substrate surface, chemically modifying the first fullerene layer to provide chemical bridging species covalently bonded thereto and effective to covalently bond with fullerenes in solution, and contacting the chemically modified fullerene layer with a solution of fullerenes to form a second fullerene layer covalently bonded to the first fullerene layer by said chemical bridging species between said first and second fullerene layers.

10. The method of claim 9 wherein the substrate surface is chemically modified to provide bond-forming species that form carbon-nitrogen covalent bonds with fullerenes in solution to form said first fullerene layer.

11. The method of claim 10 wherein the substrate surface is chemically modified prior to contacting the solution of fullerenes to provide amine bond-forming species at the chemically modified substrate surface.

12. The method of claim 9 wherein the substrate surface is chemically modified to provide bond-forming species that form carbon-carbon covalent bonds with fullerenes in solution to form said first fullerene layer.

13. The method of claim 12 wherein the substrate surface is chemically modified prior to contacting the solution of fullerenes to provide alkyl anion bond-forming species at the chemically modified substrate surface.

14. The method of claim 9 wherein the substrate surface is chemically modified to provide bond-forming species that form carbon-oxygen covalent bonds with fullerenes in solution.

15. The method of claim 14 wherein the substrate surface is chemically modified prior to contacting the solution of fullerenes to provide $OsO_4$ bond-forming species at the chemically modified substrate surface.

16. The method of claim 9 wherein the initial fullerene layer is modified to have a bifunctional piperazine covalently bonded thereto as said chemical bridging species.

17. The method of claim 9 including repeating the steps recited to form additional fullerene layers covalently bonded to a preceding fullerene layer in the modified condition.

18. A method of forming a fullerene layer on a substrate, comprising chemically modifying fullerenes to provide bond-forming species thereon, chemically modifying a surface of the substrate to provide bond-forming species effective to covalently bond with the bond-forming species of the chemically modified fullerenes in solution, and contacting a solution of the chemically modified fullerenes with the chemically modified substrate surface to form a fullerene layer covalently bonded to the chemically modified substrate surface.

19. The method of claim 18 wherein the fullerenes are chemically modified to form hydrosilated fullerenes and the substrate surface is chemically modified to provide hydroxy groups that covalently bond with the hydrosilated fullerenes in solution.

20. The method of claim 19 wherein a solution of hydrosilated $C_{60}$ and/or hydrosilated $C_{70}$ dissolved in a organic solvent is contacted with the hydroxy modified substrate surface.

21. A method forming a fullerene layer on a substrate, comprising chemically modifying a surface of the substrate to provide a prelayer comprising bond-forming species and diluant species present in an amount to control the amount of fullerenes bonded to the prelayer and contacting the prelayer with a solution of fullerenes to bond fullerenes to said bond-forming species of said prelayer.

22. A method of modifying a fullerene layer covalently bonded to a substrate, comprising subjecting the fullerene layer to a negative potential to desorb an amount of fullerenes covalently bonded to the substrate.

* * * * *